United States Patent
Haran et al.

(10) Patent No.: US 8,614,486 B2
(45) Date of Patent: Dec. 24, 2013

(54) LOW RESISTANCE SOURCE AND DRAIN EXTENSIONS FOR ETSOI

(75) Inventors: Balasubramanian S. Haran, Watervliet, NY (US); Hemanth Jagannathan, Guilderland, NY (US); Sivananda K. Kanakasabapathy, Niskayuna, NY (US); Sanjay Mehta, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/605,260

(22) Filed: Sep. 6, 2012

(65) Prior Publication Data

US 2013/0015512 A1 Jan. 17, 2013

Related U.S. Application Data

(63) Continuation of application No. 13/183,666, filed on Jul. 15, 2011.

(51) Int. Cl.
*H01L 29/02* (2006.01)
*H01L 21/02* (2006.01)

(52) U.S. Cl.
USPC ............ 257/344; 257/345; 257/346; 257/408

(58) Field of Classification Search
USPC ................... 257/344, 345, 346, 408, E21.626
See application file for complete search history.

(56) References Cited

U.S. PATENT DOCUMENTS

| | | | |
|---|---|---|---|
| 6,323,525 B1 * | 11/2001 | Noguchi et al. | 257/385 |
| 7,118,980 B2 | 10/2006 | Jain | |
| 7,176,481 B2 | 2/2007 | Chen et al. | |
| 7,642,607 B2 * | 1/2010 | Wang et al. | 257/408 |
| 7,732,285 B2 | 6/2010 | Sell et al. | |
| 7,871,869 B2 | 1/2011 | Cartier et al. | |
| 8,043,919 B2 | 10/2011 | Chen et al. | |
| 8,138,491 B2 * | 3/2012 | Appenzeller et al. | 257/9 |
| 2005/0121733 A1 * | 6/2005 | Chen et al. | 257/408 |
| 2005/0287759 A1 * | 12/2005 | Wang et al. | 438/400 |
| 2007/0257315 A1 | 11/2007 | Bedell et al. | |

(Continued)

OTHER PUBLICATIONS

Shi, H. et al., "Molecular Dynamics Simulation of Ion Implantation into HfO2 and HfO2/Si Multi-Layer Structure" Chinese Phys. Letters (Jan. 2005) pp. 76-79, vol. 22, No. 1.

(Continued)

*Primary Examiner* — Ngan Ngo
(74) *Attorney, Agent, or Firm* — Scully, Scott, Murphy & Presser, P.C.; Daniel P. Morris

(57) ABSTRACT

A gate dielectric is patterned after formation of a first gate spacer by anisotropic etch of a conformal dielectric layer to minimize overetching into a semiconductor layer. In one embodiment, selective epitaxy is performed to sequentially form raised epitaxial semiconductor portions, a disposable gate spacer, and raised source and drain regions. The disposable gate spacer is removed and ion implantation is performed into exposed portions of the raised epitaxial semiconductor portions to form source and drain extension regions. In another embodiment, ion implantation for source and drain extension formation is performed through the conformal dielectric layer prior to an anisotropic etch that forms the first gate spacer. The presence of the raised epitaxial semiconductor portions or the conformation dielectric layer prevents complete amorphization of the semiconductor material in the source and drain extension regions, thereby enabling regrowth of crystalline source and drain extension regions.

10 Claims, 14 Drawing Sheets

(56) References Cited

U.S. PATENT DOCUMENTS

| | | | |
|---|---|---|---|
| 2009/0289305 A1 | 11/2009 | Majumdar et al. | |
| 2010/0120263 A1 | 5/2010 | Hsueh et al. | |
| 2010/0171186 A1* | 7/2010 | Xiao | 257/408 |
| 2010/0314694 A1* | 12/2010 | Mayuzumi et al. | 257/408 |
| 2011/0027956 A1 | 2/2011 | Domenicucci et al. | |
| 2011/0070703 A1 | 3/2011 | Xiong et al. | |
| 2012/0032277 A1* | 2/2012 | Manabe | 257/408 |
| 2012/0104470 A1 | 5/2012 | Ponoth et al. | |
| 2012/0139042 A1* | 6/2012 | Fu et al. | 257/344 |
| 2012/0181625 A1* | 7/2012 | Kwok et al. | 257/408 |
| 2012/0193710 A1 | 8/2012 | Cheng et al. | |
| 2012/0205715 A1* | 8/2012 | Kwok et al. | 257/190 |
| 2012/0299103 A1 | 11/2012 | Cheng et al. | |
| 2012/0299121 A1* | 11/2012 | Wu et al. | 257/408 |
| 2012/0319203 A1* | 12/2012 | Cheng et al. | 257/346 |
| 2013/0001575 A1 | 1/2013 | Bhattacharyya et al. | |
| 2013/0009257 A1 | 1/2013 | Ando et al. | |
| 2013/0011975 A1 | 1/2013 | Cheng et al. | |

OTHER PUBLICATIONS

Majumdar, A. et al., "High-Performance Undoped-Body 8-nm-Thin SOI Field-Effect Transistors" IEEE Electron Device Letters (May 2008) pp. 515-517, vol. 29, No. 5.

Majumdar, A. et al., Gate Length and Performance Scaling of Undoped-Body Extremely Thin SOI MOSFETs IEEE Electron Device Letters (Apr. 2009) pp. 413-415, vol. 30, No. 4.

Cheng, K. et al., "Extremely Thin SOI (ETSOI) CMOS with Record Low Variability for Low Power System-on-Chip Applications" IEEE International Electron Devices Meetings (IEDM) (Dec. 7-9, 2009) pp. IEDM09-49-IEDM09-52.

* cited by examiner

LOW RESISTANCE SOURCE AND DRAIN EXTENSIONS FOR ETSOI

CROSS REFERENCE TO RELATED APPLICATION

This application is a continuation of U.S. patent application Ser. No. 13/183,666, filed Jul. 15, 2011 the entire content and disclosure of which is incorporated herein by reference.

BACKGROUND

The present disclosure generally relates to semiconductor structures, and particularly to semiconductor-on-insulator (SOI) field effect transistors having raised source/drain regions, and methods of manufacturing the same.

Extremely thin semiconductor-on-insulator (ETSOI) field effect transistors are leading candidates for advanced semiconductor devices for enabling continuous scaling of planar semiconductor technology. Successful manufacture of ETSOI field effect transistors requires integration of n-type metal oxide semiconductor (nMOS) field effect transistors and p-type metal oxide semiconductor (pMOS) field effect transistors onto a same semiconductor substrate, while maintaining high performance and low leakage current.

A key feature to improve performance and reduce series resistance in ETSOI field effect transistors is the use of raised source drain (RSD) epitaxy, which enables formation of thick low-resistance source and drain regions on a thin top semiconductor layer of an ETSOI substrate. Ideal junction design for ETSOI field effect transistors with RSD involves low source and drain (S/D) resistance, low source and drain extension resistance, and good physical connection between the source and drain regions and the source and drain extension regions that provides a low resistance connection therebetween.

One of the challenges in manufacture of the ETSOI field effect transistors is the amorphization of a single crystalline semiconductor material during ion implantation for formation of source/drain extension regions. Because the thickness of a top semiconductor layer in an ETSOI substrate can be on the order of 5 nm and it is very difficult to provide an implantation depth less than 5 nm, ion implantation intended to provide electrical dopants into source/drain regions can completely amorphize the semiconductor material in the implanted region down to the interface with a buried insulator layer and prevent recrystallization of the implanted source and drain extension regions into single crystalline regions. In order to provide low resistance in source and drain extension regions, therefore, the source and drain extension regions need to recover a single crystalline structure during a regrowth process after ion implantation.

SUMMARY

A gate dielectric is patterned after formation of a first gate spacer by anisotropic etch of a conformal dielectric layer to minimize overetching into a semiconductor layer. In one embodiment, selective epitaxy is performed to sequentially form raised epitaxial semiconductor portions, a disposable gate spacer, and raised source and drain regions. The disposable gate spacer is removed and ion implantation is performed into exposed portions of the raised epitaxial semiconductor portions to form source and drain extension regions. In another embodiment, ion implantation for source and drain extension formation is performed through the conformal dielectric layer prior to an anisotropic etch that forms the first gate spacer. The presence of the raised epitaxial semiconductor portions or the conformation dielectric layer prevents complete amorphization of the semiconductor material in the source and drain extension regions, thereby enabling regrowth of crystalline source and drain extension regions.

According to an aspect of the present disclosure, a method of forming a semiconductor structure is provided. The method includes: forming a gate structure including at least a gate dielectric, a gate electrode, and a first gate spacer on a semiconductor substrate, wherein outer sidewalls of the first gate spacer is vertically coincident with sidewalls of the gate dielectric; forming raised epitaxial semiconductor portions contacting the sidewalls of the gate dielectric on a semiconductor layer in the semiconductor substrate; forming a disposable gate spacer on the first gate spacer and over peripheral regions of the raised epitaxial semiconductor portions; forming raised source and drain regions on the raised epitaxial semiconductor portions;

removing the disposable gate spacer; and forming source and drain extension regions by implanting electrical dopants through cavities between the gate structure and the raised source and drain regions and into the semiconductor layer and the raised epitaxial semiconductor portions.

According to another aspect of the present disclosure, another method of forming a semiconductor structure is provided. The method includes: forming a gate dielectric layer having a dielectric constant greater than 8.0 on a surface of a semiconductor layer in a semiconductor substrate; forming a gate electrode on the gate dielectric layer; forming a dielectric material layer on sidewalls of the gate electrode and a top surface of the gate dielectric layer; forming source and drain extension regions by implanting electrical dopants through the dielectric material layer and the gate dielectric layer into upper portions of the semiconductor layer; and anisotropically etching the dielectric material layer and the gate dielectric layer, wherein a top surface of the semiconductor layer is exposed after the anisotropic etching.

According to yet another aspect of the present disclosure, a semiconductor structure is provided, which includes: a gate structure including at least a gate dielectric, a gate electrode, and a first gate spacer and located on a semiconductor layer in a semiconductor substrate, wherein outer sidewalls of the first gate spacer is vertically coincident with sidewalls of the gate dielectric; source and drain extension regions that contact surfaces of the sidewalls of the gate dielectric; and raised source and drain regions located on the semiconductor layer and having top surfaces located above topmost surfaces of the source and drain extension regions.

According to still another aspect of the present disclosure, another semiconductor structure is provided, which includes: a gate structure including at least a gate dielectric, a gate electrode, and a first gate spacer and located on a semiconductor layer in a semiconductor substrate, wherein outer sidewalls of the first gate spacer is vertically coincident with sidewalls of the gate dielectric, and the gate dielectric has a dielectric constant greater than 8.0; a second gate spacer contacting the outer sidewalls of the first gate spacer, the sidewalls of the gate dielectric, and top surfaces of the semiconductor layer; raised source and drain regions located on the semiconductor layer and contacting outer sidewalls of the second gate spacer.

DETAILED DESCRIPTION

Figure 1:
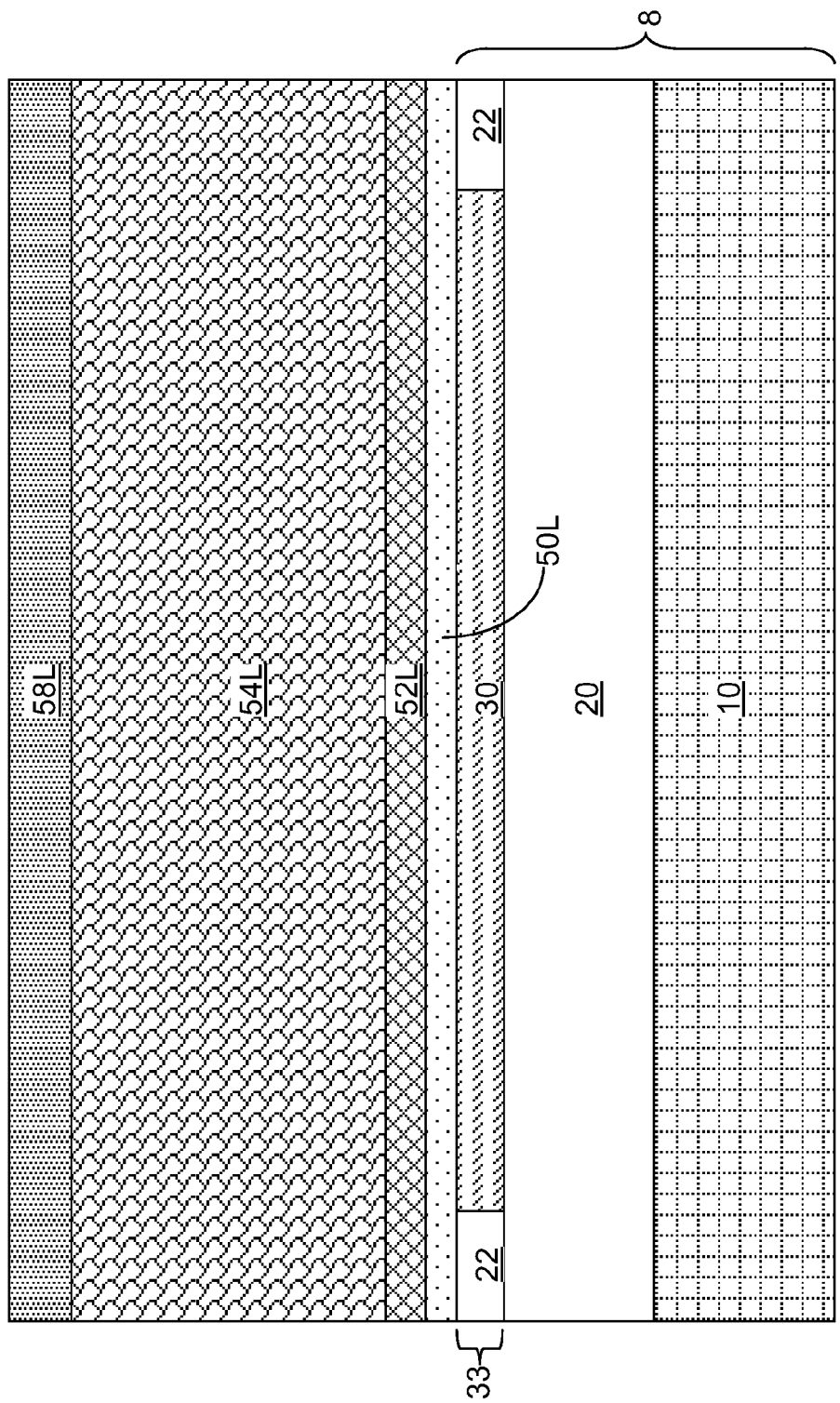
FIG. 1 is a vertical cross-sectional view of a first exemplary semiconductor structure after formation of gate stack layers on a substrate according to a first embodiment of the present disclosure.

As stated above, the present disclosure relates to semiconductor-on-insulator (SOI) field effect transistors having raised source/drain regions and methods of manufacturing the same, which are now described in detail with accompanying figures. It is noted that like reference numerals refer to like elements across different embodiments. The drawings are not necessarily drawn to scale.

Referring FIG. 1, a first exemplary semiconductor structure according to a first embodiment of the present disclosure includes a semiconductor substrate 8, which can be a semiconductor-on-insulator (SOI) substrate including a stack, from bottom to top, of a handle substrate 10, a buried insulator layer 20, and a semiconductor layer including a single crystalline semiconductor material portion 30. The semiconductor layer is herein referred to as a top semiconductor layer 33.

The handle substrate 10 can be a semiconductor substrate including a single crystalline semiconductor material such as single crystalline silicon, a polycrystalline semiconductor material, an amorphous semiconductor material, or a stack thereof. The thickness of the handle substrate 10 can be from 50 microns to 1,000 microns, although lesser and greater thicknesses can also be employed. The buried insulator layer 20 includes a dielectric material such as silicon oxide, silicon nitride, silicon oxynitride, or a combination thereof. The thickness of the buried insulator layer 20 can be form 15 nm to 500 nm, although lesser and greater thicknesses can also be employed. The thickness of the top semiconductor layer 33 can be from 3 nm to 60 nm, and typically from 5 nm to 10 nm, although lesser and greater thicknesses can also be employed.

The single crystalline semiconductor material portion 30 as originally provided in the top semiconductor layer 33 can a single crystalline semiconductor layer contiguously extending over the entirety of the buried insulator layer 20. Shallow trench isolation structures 22 can be formed in the top semiconductor layer 33 employing methods known in the art, e.g., by forming trenches extending from the top surface of the top semiconductor layer 33 at least to the top surface of the buried insulator layer 20, filling the trenches with a dielectric material, and removing excess dielectric material from above the top surface of the top semiconductor layer 33.

Gate stack layers are formed over the semiconductor substrate 8. Specifically, a gate dielectric layer 50L, at least one gate electrode layer, and a gate cap dielectric layer 58L are sequentially deposited, for example, by various atomic layer deposition (ALD) and/or chemical vapor deposition (CVD) processes. The at least one gate electrode layer can include, for example, a stack of a work function metallic layer 52L and a gate conductor layer 54L.

The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, and preferably from 1.0 nm to 3 nm, although lesser and greater thicknesses can also be employed.

The work function metallic layer 52L is optional, i.e., may, or may not be present. The work function metallic layer 52L can include a metallic material that optimizes the performance of a transistor to be subsequently formed. Metallic materials that can be included in the work function metallic layer 52L include, but are not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, alloys thereof, conductive oxides thereof, conductive nitrides thereof, and any combinations of the foregoing. The work function metallic layer 52L can be deposited, for example, by atomic layer deposition (ALD), chemical vapor deposition (CVD) and/or physical vapor deposition and/or any other deposition methods available in the art. The thickness of the work function metallic layer 52L can be from 20 nm to 100 nm, although lesser and greater thicknesses can also be employed.

The gate conductor layer 54L includes a conductive material, which can be a doped semiconductor material, a metallic material, or a combination thereof. The doped semiconductor material, if employed, can be doped polysilicon, doped polycrystalline germanium, a doped silicon-germanium alloy, any other doped elemental or compound semiconductor material, or a combination thereof. The metallic material can be any metallic material that can be deposited by chemical vapor deposition (CVD), physical vapor deposition (PVD), or a combination thereof. For example, the metallic material can include aluminum and/or tungsten. The thickness of the gate conductor layer 54L can be from 100 nm to 500 nm, although lesser and greater thicknesses can also be employed.

The gate cap dielectric layer 58L includes a dielectric material such as silicon nitride, silicon oxide, organosilicate glass (OSG), a high dielectric constant (high-k) material layer that can be employed for the gate dielectric layer 50L, or a combination thereof. The gate cap dielectric layer 58L can be deposited, for example, by chemical vapor deposition or by any other deposition method known in the art. The thickness of the gate cap dielectric layer 58L can be from 10 nm to 200 nm, and typically from 20 nm to 100 nm, although lesser and greater thicknesses can also be employed.

Figure 2:
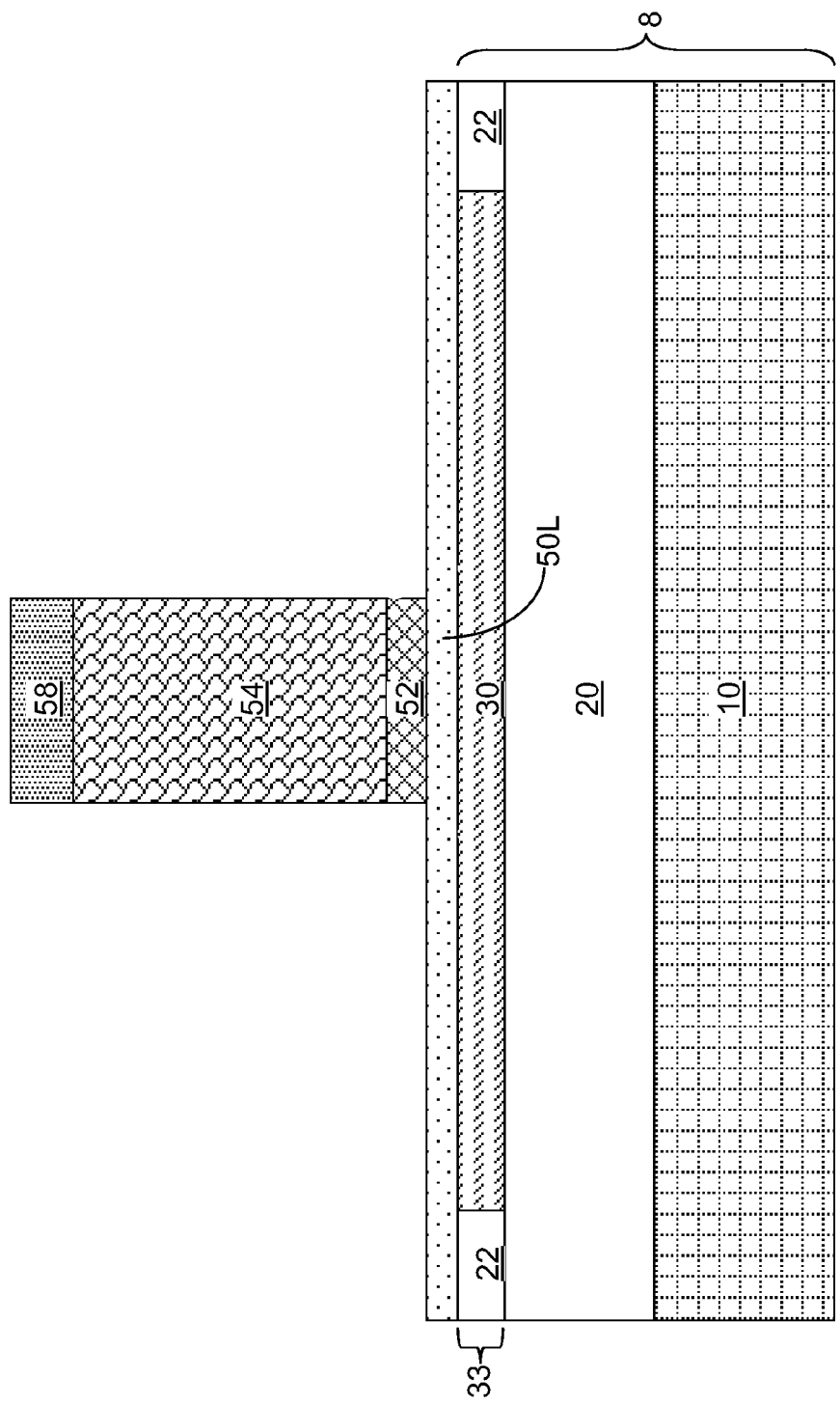
FIG. 2 is a vertical cross-sectional view of the first exemplary semiconductor structure after patterning of a gate stack according to the first embodiment of the present disclosure.

Referring to FIG. 2, a gate stack is formed by patterning the gate stack layers except the gate dielectric layer 50L. Specifically, the gate cap dielectric layer 58L and the at least one gate electrode layer (54L, 52L) are patterned by an anisotropic etch process employing a patterned photoresist (not shown) as a masking layer. The gate dielectric layer 50L is employed as an etch stop layer during the anisotropic etch process so that the anisotropic etch stops on the top surface of the gate dielectric layer 50L.

The remaining portion of the gate cap dielectric layer 58L is herein referred to as a gate cap dielectric 58. The remaining portion of the gate conductor layer 54L is herein referred to as a gate conductor portion 54. The remaining portion of the work function metallic layer 52L is herein referred to as a work function metallic portion 52. The stack of the work function metallic portion 52 and the gate conductor portion 54 constitutes a gate electrode (52, 54). The sidewalls of the gate electrode (52, 54) are vertically coincident, i.e., coincide in a top down view along a direction perpendicular to the top surface of the semiconductor substrate 8, with the sidewalls of the gate cap dielectric 58.

Figure 3:
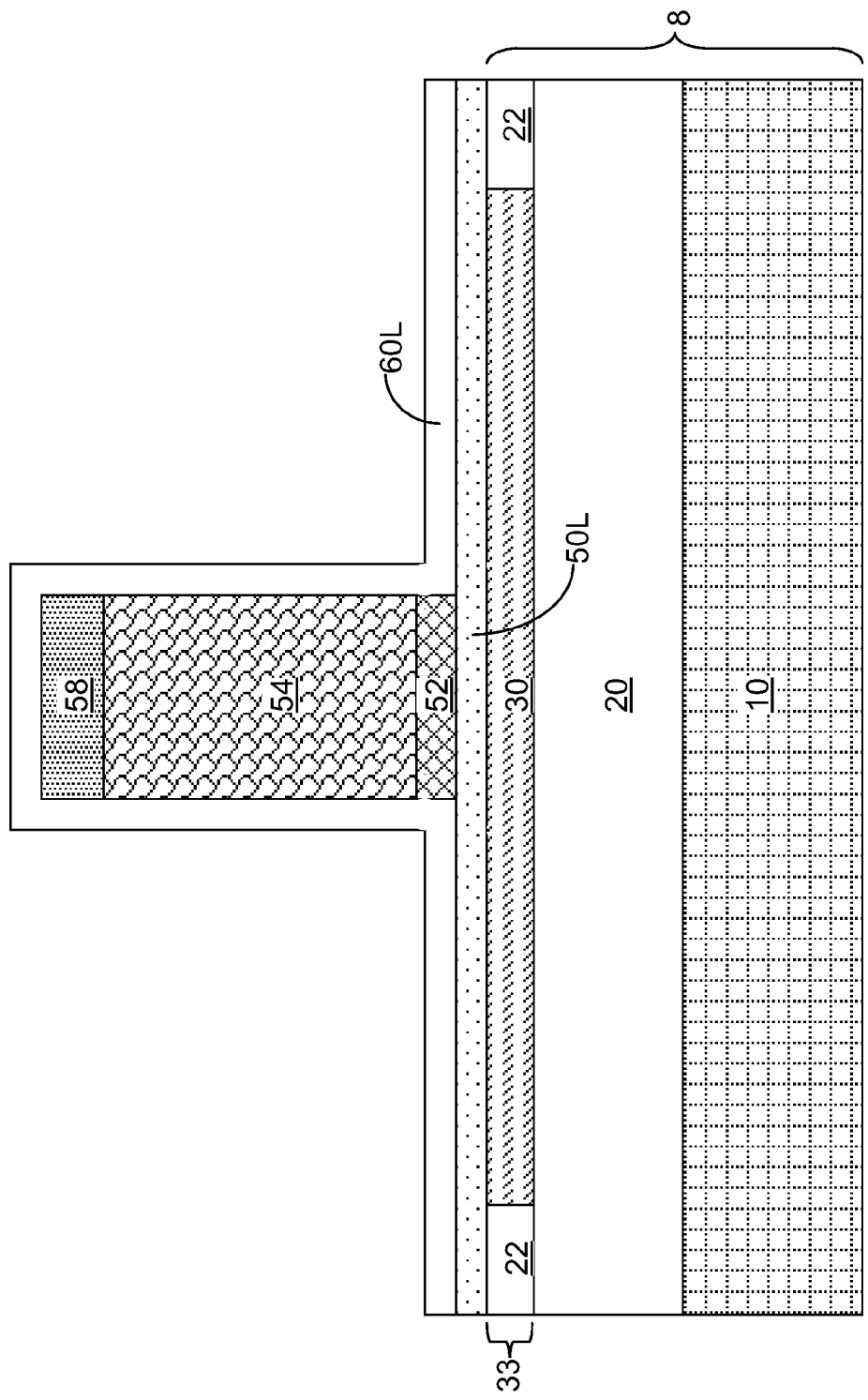
FIG. 3 is a vertical cross-sectional view of the first exemplary semiconductor structure after formation of a conformal dielectric layer according to the first embodiment of the present disclosure.

Referring to FIG. 3, a conformal dielectric layer 60L is deposited on sidewalls of the gate cap dielectric 58, sidewalls of the gate electrode (52, 54), and a top surface of the gate dielectric layer 50L. The conformal dielectric layer 60L is a dielectric material layer that includes a dielectric material such as silicon oxide, silicon nitride, silicon oxynitride, a dielectric metal oxide, a dielectric metal nitride, a dielectric oxynitride, or a combination thereof. The conformal dielectric layer 60L can be deposited, for example, by atomic layer deposition (ALD) or hchemical vapor deposition (CVD). In one embodiment, the conformal dielectric layer 60L can have a same thickness in vertical portions as in horizontal portions. The thickness of the conformal dielectric layer 60L can be from 1 nm to 50 nm, and typically from 2 nm to 15 nm, although lesser and greater thicknesses can also be employed.

Figure 4:
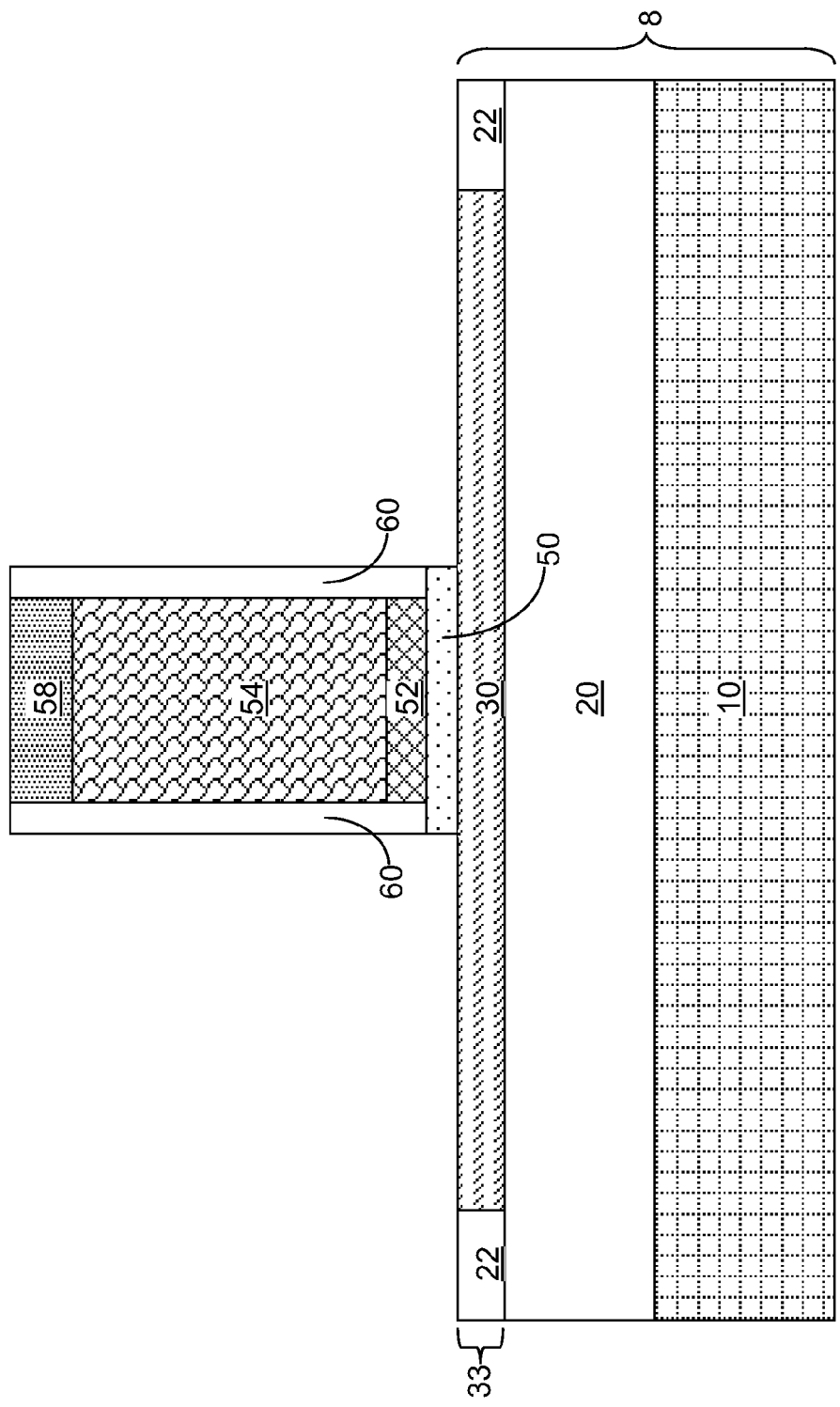
FIG. 4 is a vertical cross-sectional view of the first exemplary semiconductor structure after formation of a first gate spacer and a gate dielectric according to the first embodiment of the present disclosure.

Referring to FIG. 4, the conformal dielectric layer 60L and the gate dielectric layer 50L are anisotropically etched in an anisotropic etch process. The top surface of the top semiconductor layer 33 is exposed after the anisotropic etching. A remaining portion of the gate dielectric layer 50L is a gate dielectric 50, and a remaining portion of the conformal dielectric layer 60L is a first gate spacer 60 that laterally surrounds the gate electrode (52, 54) and the gate cap dielectric 58. A gate structure is formed on the semiconductor substrate 8. The gate structure includes the gate dielectric 50, the gate electrode (52, 54), the gate cap dielectric 58, and the first gate spacer 60. The entirety of the outer sidewalls of the first gate spacer 60 is vertically coincident with the entirety of the sidewalls of the gate dielectric 50.

Figure 5:
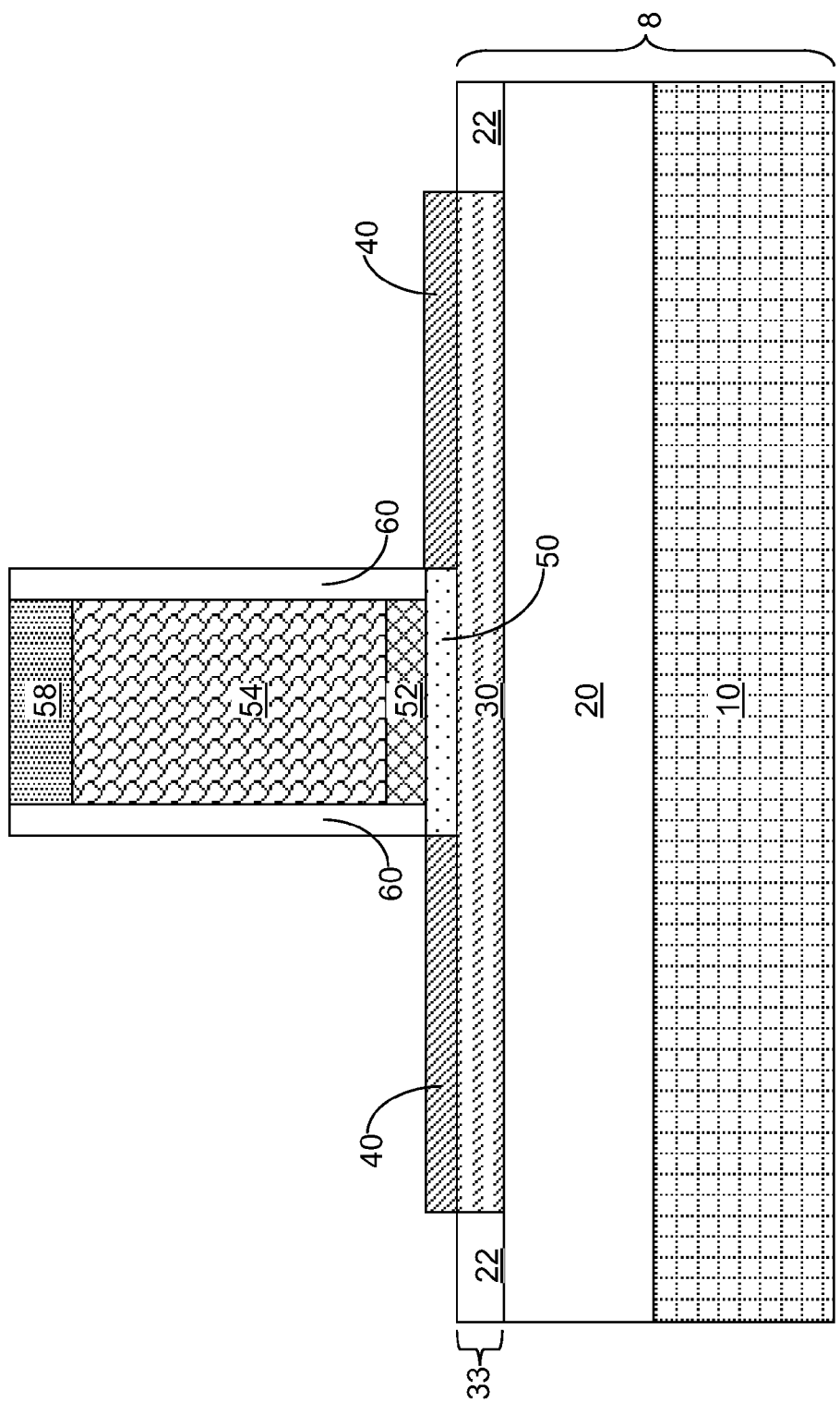
FIG. 5 is a vertical cross-sectional view of the first exemplary semiconductor structure after formation of raised epitaxial semiconductor portions according to the first embodiment of the present disclosure.

Referring to FIG. 5, raised epitaxial semiconductor portions 40 are formed, for example, by epitaxial growth of a semiconductor material on the surfaces of the semiconductor material of the single crystalline semiconductor material portion 30.

In one embodiment, the raised epitaxial semiconductor portions 40 include the same semiconductor material as the single crystalline semiconductor material portion 30. For example, the raised epitaxial semiconductor portions 40 and the single crystalline semiconductor material portion 30 include single crystalline silicon.

In one embodiment, the raised epitaxial semiconductor portions 40 and the single crystalline semiconductor material portion 30 include an undoped single crystalline semiconductor material. In another embodiment, the single crystalline semiconductor material portion 30 includes an undoped single crystalline semiconductor material, and the raised epitaxial semiconductor portions 40 includes an in-situ doped single crystalline semiconductor material, which is different from the undoped single crystalline semiconductor material only by the presence of electrical dopants such as B, Al, Ga, P, As, and Sb therein.

In one embodiment, the raised epitaxial semiconductor portions 40 include a different semiconductor material from the semiconductor material of the single crystalline semiconductor material portion 30. For example, the single crystalline semiconductor material portion 30 include single crystalline silicon, and the raised epitaxial semiconductor portions 40 includes a single crystalline silicon-germanium alloy, a single crystalline silicon-carbon alloy, or any single crystalline semiconductor material that can be epitaxially grown on single crystalline silicon.

In one embodiment, the single crystalline semiconductor material portion 30 includes a first undoped single crystalline semiconductor material, and the raised epitaxial semiconductor portions 40 includes a second undoped single crystalline semiconductor material that is different undoped single crystalline semiconductor material. In another embodiment, the single crystalline semiconductor material portion 30 includes an undoped first single crystalline semiconductor material, and the raised epitaxial semiconductor portions 40 includes an in-situ doped second single crystalline semiconductor material. The in-situ doped second single crystalline semiconductor material is different from the undoped first single crystalline semiconductor material by the composition of semiconducting elements and by the presence of electrical dopants such as B, Al, Ga, P, As, and Sb therein.

The raised epitaxial semiconductor portions 40 can contact the sidewalls of the gate dielectric 50. The thickness of the raised epitaxial semiconductor portions 40 can be from 1 nm to 10 nm, and typically from 2 nm to 6 nm, although lesser and greater thicknesses can also be employed.

Figure 6:
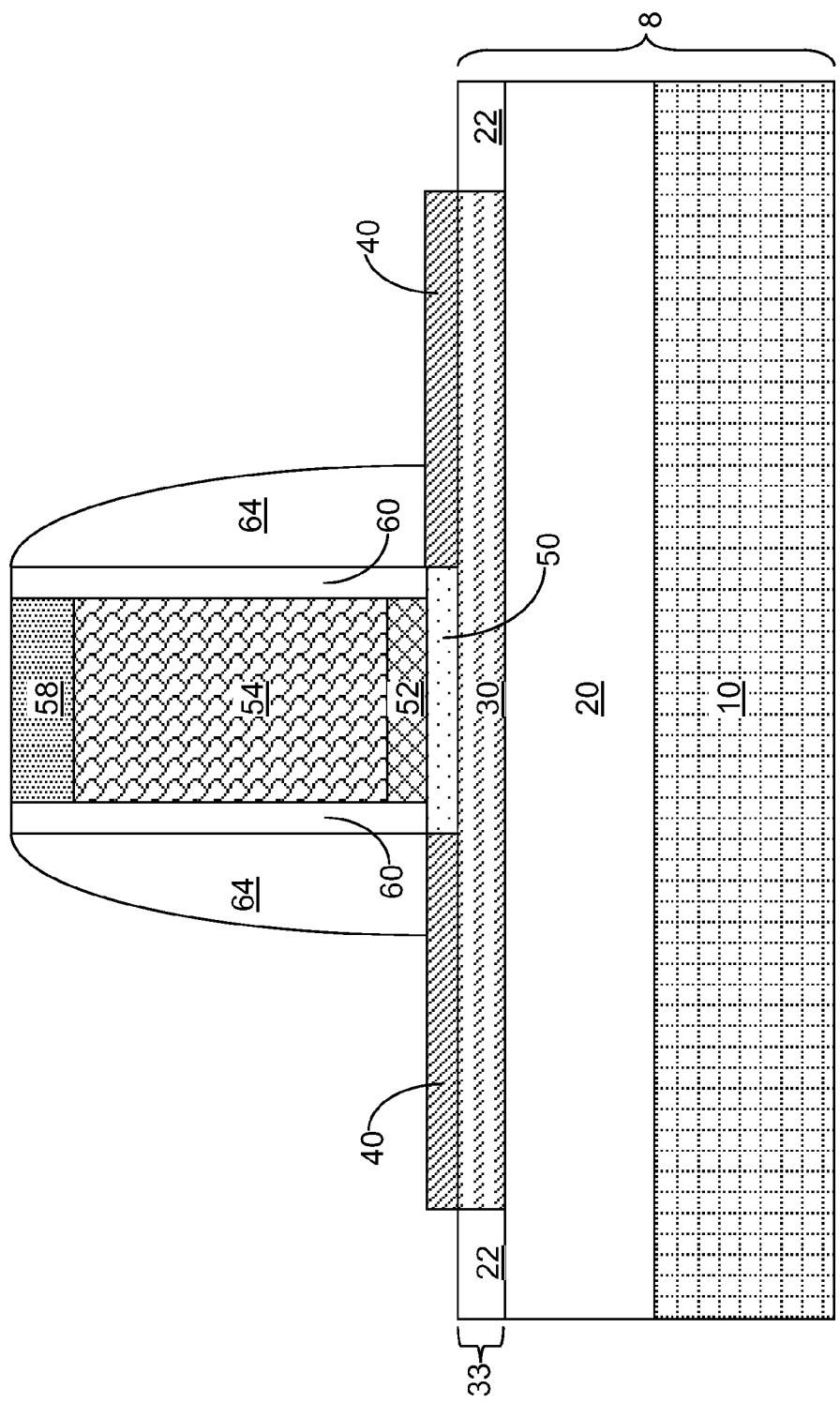
FIG. 6 is a vertical cross-sectional view of the first exemplary semiconductor structure after formation of a disposable gate spacer according to the first embodiment of the present disclosure.

Referring to FIG. 6, a disposable gate spacer 64 is formed on sidewalls of the first gate spacer 60, for example, by conformal deposition of a dielectric material layer and an anisotropic etch that removes horizontal portions of the dielectric material layer. The anisotropic etch is selective to the semiconductor material of the raised epitaxial semiconductor portions 40. The remaining portion of the dielectric material layer constitutes the disposable gate spacer 64. The disposable gate spacer 64 includes a dielectric material that is different from the dielectric material of the first gate spacer 60. The disposable gate spacer 64 contacts the first gate spacer 60 and is located over proximal peripheral regions of the raised epitaxial semiconductor portions 40, i.e., the peripheral regions of the raised epitaxial semiconductor portions 40 that are proximal to the gate electrode (52, 54). The thickness of the disposable gate spacer 64, as measured at the base of the disposable gate spacer 64 contacting the raised epitaxial semiconductor portions 40, can be from 10 nm to 100 nm, and typically from 15 nm to 60 nm, although lesser and greater thicknesses can also be employed.

Figure 7:
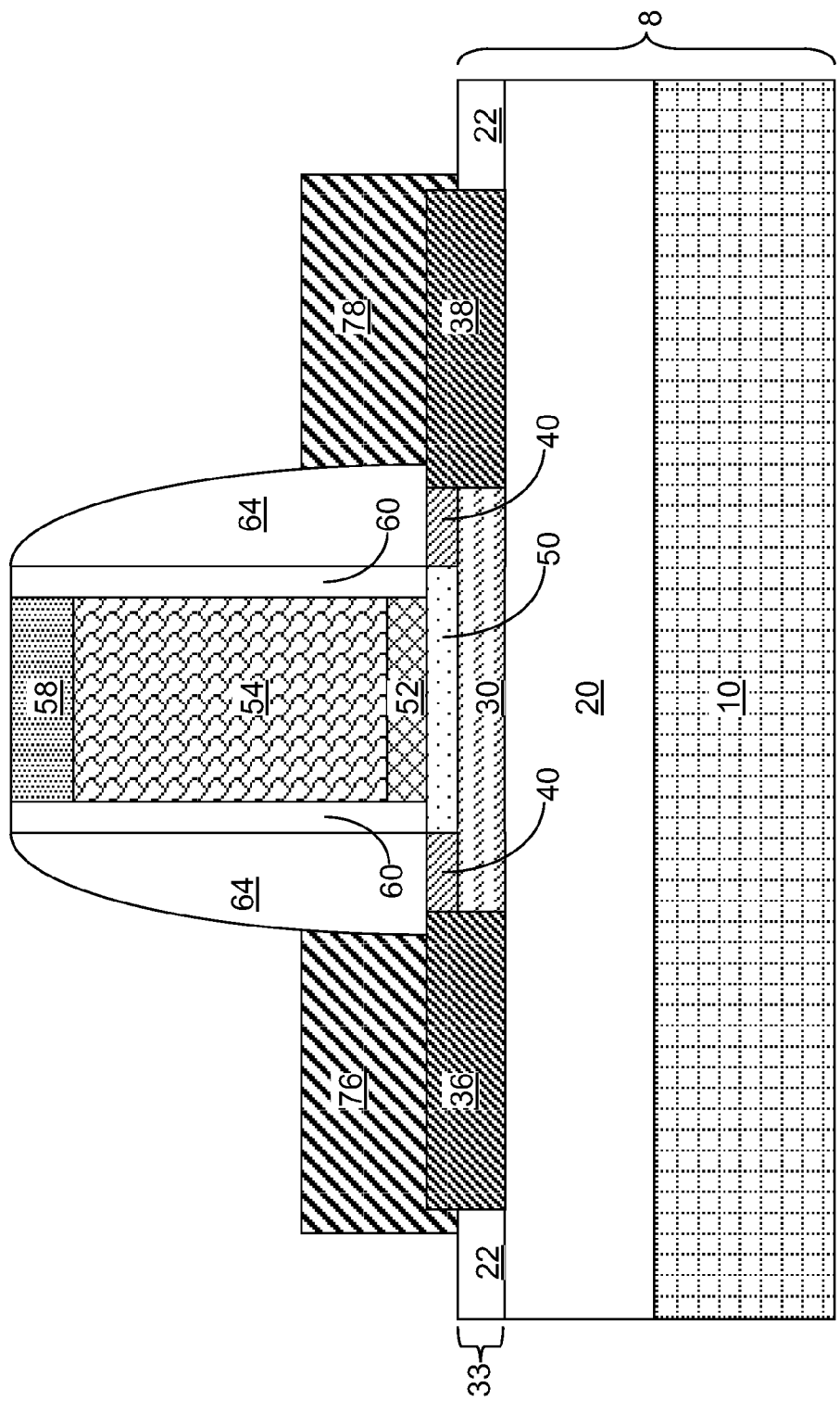
FIG. 7 is a vertical cross-sectional view of the first exemplary semiconductor structure after formation of raised source and drain regions according to the first embodiment of the present disclosure.

Referring to FIG. 7, raised source and drain regions are formed, for example, by selective epitaxy. The raised source and drain regions include a raised source region 76 and a raised drain region 78. The raised source and drain regions (76, 78) include a single crystalline semiconductor material that is epitaxially aligned to the underlying semiconductor material, which is the semiconductor material of the raised epitaxial semiconductor portions 40. The semiconductor material of the raised source and drain regions (76, 78) can be the same as, or different from, the semiconductor material of the raised epitaxial semiconductor portions 40 and/or the semiconductor material of the single crystalline semiconductor material portion 30.

In one embodiment, the raised source and drain regions (76, 78) are formed with in-situ doping so that the raised source and drain regions (76, 78) are doped with electrical dopants during selective epitaxy. If the raised epitaxial semiconductor portions 40 are doped with electrical dopants, the raised source and drain regions 78 can be doped with electrical dopants of the same type as the electrical dopants of the raised source and drain regions (76, 78). The electrical dopants of the raised source and drain regions (76, 78) can be either p-type or n-type.

Planar source and drain regions are formed underneath the raised source and drain regions (76, 78). Specifically, a planar source region 36 is formed by doping the region of a raised epitaxial semiconductor portion 40 located directly underneath the raised source region 76 and by doping the region of the single crystalline semiconductor material portion 30 underneath the raised source region 76 with electrical dopants of the same type as the electrical dopants in the raised source region 76. Likewise, a planar drain region 38 is formed by doping the region of a raised epitaxial semiconductor portion 40 located directly underneath the raised drain region 78 and by doping the region of the single crystalline semiconductor material portion 30 underneath the raised drain region 78 with electrical dopants of the same type as the electrical dopants in the raised drain region 78.

In one embodiment, the planar source and drain regions (36, 38) can be doped by thermal diffusion of the electrical dopants in the raised source and drain regions (76, 78) during in-situ doped selective epitaxy or a thermal anneal that is performed after the in-situ doped selective epitaxy.

Alternately, the raised source and drain regions (76, 78) are formed without doping so that the raised source and drain regions (76, 78) are formed as intrinsic semiconductor material portions. Electrical dopants can be subsequently introduced into the raised source and drain regions (76, 78) by ion implantation, plasma doping, and/or gas phase doping. Further, the planar source and drain regions (36, 38) can be doped by a subsequent thermal anneal, during which dopants diffuse into underlying semiconductor materials in the regions of the raised epitaxial semiconductor portions 40 located directly underneath the raised source and drain regions (76, 78) and the regions of the single crystalline semiconductor material portion 30 located underneath the raised source and drain regions (76, 78).

Figure 8:
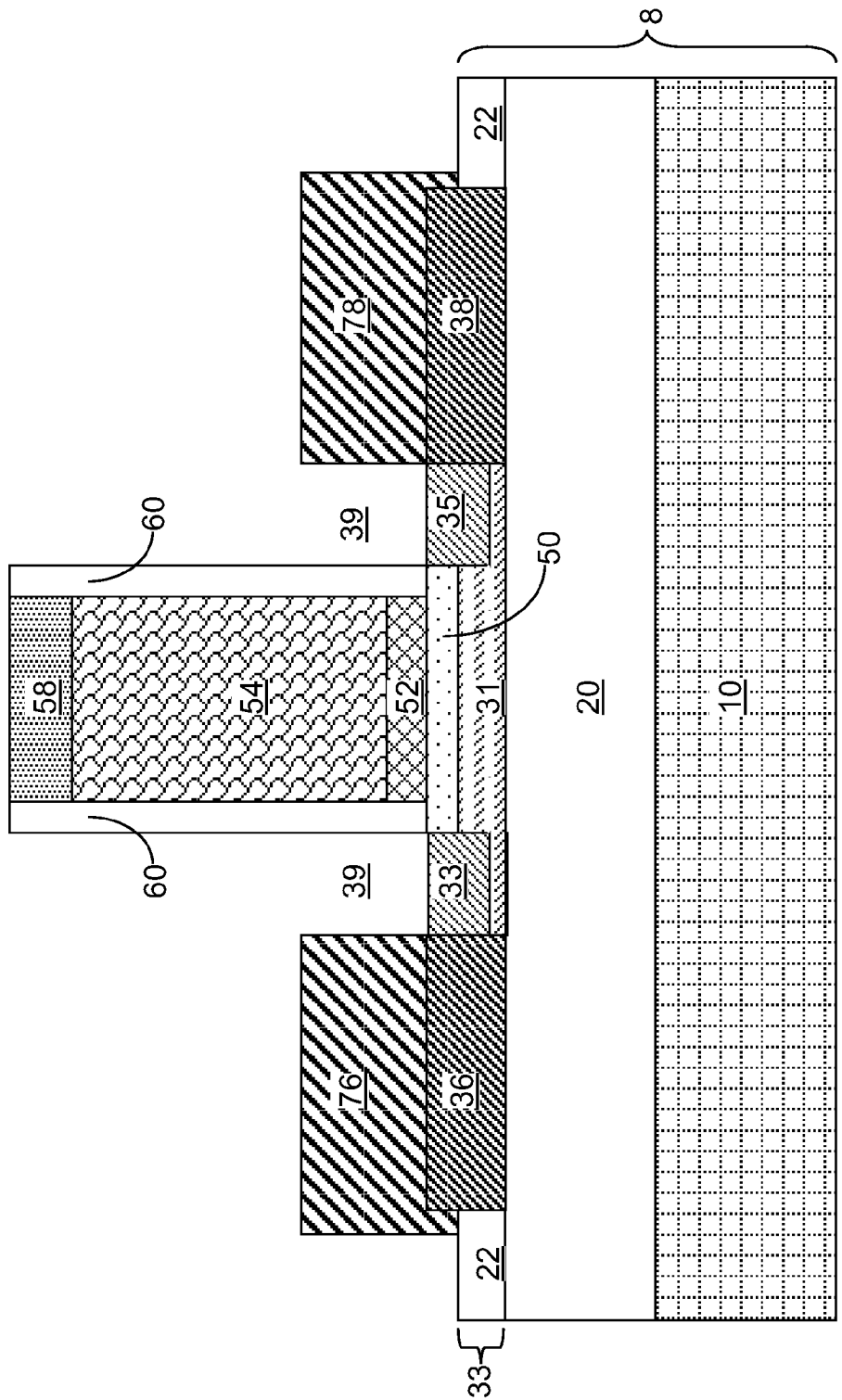
FIG. 8 is a vertical cross-sectional view of the first exemplary semiconductor structure after removal of the disposable gate spacer according to the first embodiment of the present disclosure.

Referring to FIG. 8, the disposable gate spacer 64 is removed selective to the semiconductor material of the raised source and drain regions (76, 78). In one embodiment, the disposable gate spacer 64 is removed selective to the semiconductor material of the raised source and drain regions (76, 78) and to the dielectric material of the first gate spacer 60. Cavities 39 are formed around the gate stack structure (50, 52, 54, 58, 60), and specifically, between the gate stack structure (50, 52, 54, 58, 60) and the raised source and drain regions (76, 78).

Electrical dopants of the same conductivity type as the electrical dopants in the raised source and drain regions (76, 78) are introduced into remaining raised epitaxial semiconductor portions 40 and upper regions of the single crystalline semiconductor material portion 30 that are located underneath the exposed surfaces of the remaining raised epitaxial semiconductor portions 40. The electrical dopants can be introduced, for example, by ion implantation, plasma doping, or gas phase doping. If the electrical dopants are introduced by ion implantation, an amorphized source extension region 33 and an amorphized drain extension region 35 are formed in regions that are implanted with the electrical dopants. The unimplanted portion of the single crystalline semiconductor material portion 30 is herein referred to as a body portion 31.

A vertical stack of an unimplanted single crystalline semiconductor region and an amorphized implanted region are formed below each cavity 39 through which the electrical dopants are implanted. Specifically, the vertical stack of a peripheral bottom region of the body portion 31 and the amorphized source extension region 33 form a first vertical stack of an unimplanted single crystalline semiconductor region and an amorphized implanted region, and the vertical stack of another peripheral bottom region of the body portion 31 and the amorphized drain extension region 35 form a second vertical stack of an unimplanted single crystalline semiconductor region and an amorphized implanted region.

The peripheral bottom regions of the body portion 31 that are unimplanted single crystalline semiconductor regions include at least one monolayer of single crystalline semiconductor material, which remains single crystalline after the implantation of the electrical dopants to form the amorphized source extension region 33 and the amorphized drain extension region 35.

Figure 9:
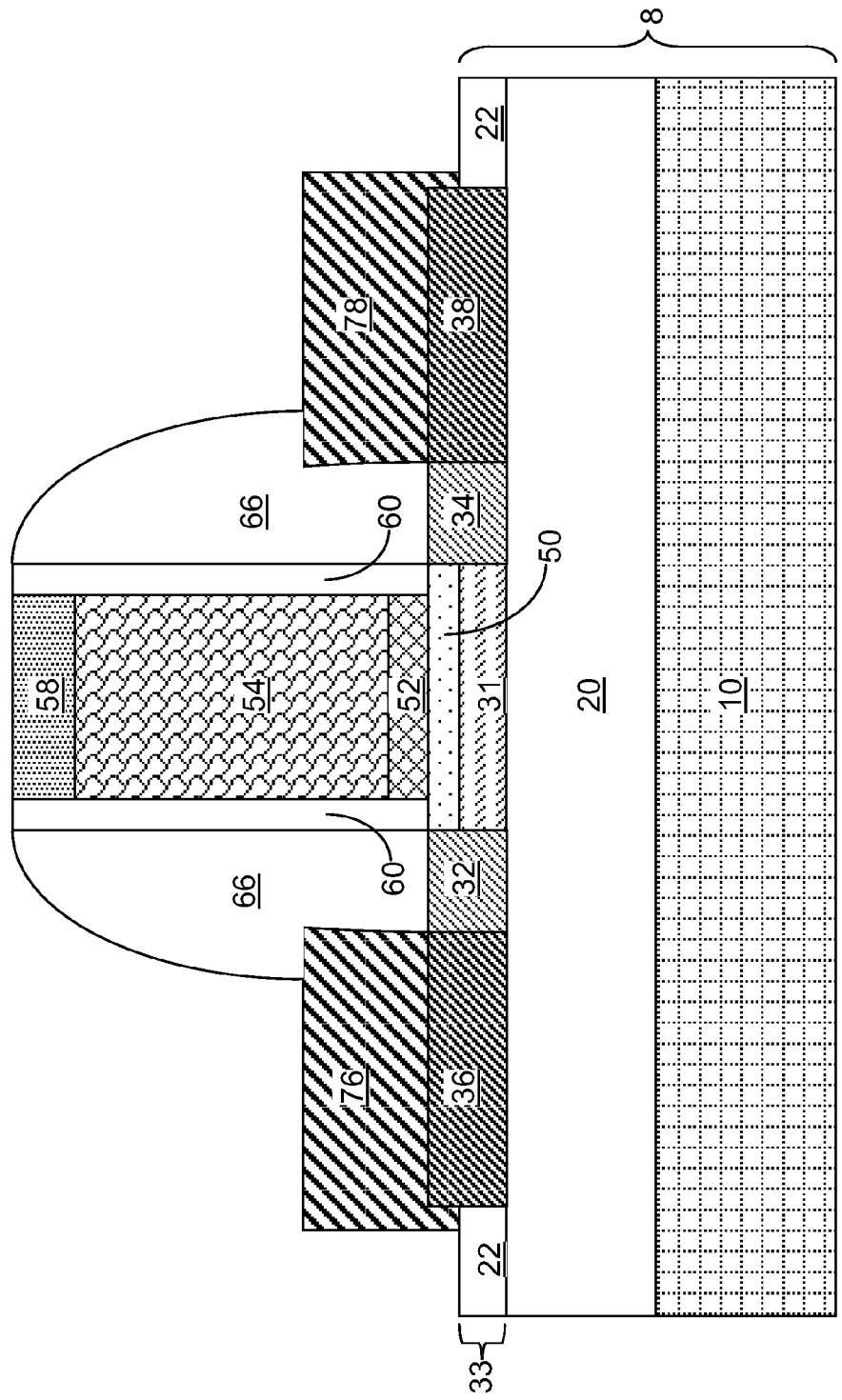
FIG. 9 is a vertical cross-sectional view of the first exemplary semiconductor structure after formation of a second gate spacer according to the first embodiment of the present disclosure.

Referring to FIG. 9, a second gate spacer 66 is formed, for example, by conformal deposition of a dielectric material layer and an anisotropic etch that removes the horizontal portions of the dielectric material layer. The remaining vertical portions of the dielectric material layer constitute the second gate spacer 66. The second gate spacer 66 includes a dielectric material such as silicon oxide, silicon nitride, and/or organosilicate glass (OSG). In one embodiment, the second gate spacer includes a dielectric material having a dielectric constant less than 3.0 such as organosilicate glass. The second gate spacer 66 can completely fill the cavities 39, and overlies proximal peripheral portions of the raised source and drain regions (76, 78), i.e., the portions of the raised source and drain regions (76, 78) that are close to the gate electrode (52, 54).

The amorphized source and drain extension regions (33, 35) are annealed after the implantation and the entirety of each of the amorphized source and drain extension regions (33, 35) become single crystalline after the annealing. During the anneal, the at least one monolayer of single crystalline semiconductor material located underneath the amorphized source and drain extension regions (33, 35) functions as the seed layer for recrystallization, and the amorphous doped semiconductor material is recrystallized to become single crystalline doped semiconductor materials. Specifically, the amorphized source extension region 33 becomes a single crystalline source extension region 32, and the amorphized drain extension region 35 becomes a single crystalline drain extension region 34. Thus, the entirety of the semiconductor materials in the body portion 31, the single crystalline source extension region 32, the single crystalline drain extension region 34, the planar source region 36, the planar drain region 38, the raised source region 76, and the raised drain region 78 are epitaxially aligned among one another. The single crystalline source extension region 32, the single crystalline drain extension region 34, the planar source region 36, the planar drain region 38, the raised source region 76, and the raised drain region 78 are doped with electrical dopants of the same conductivity type.

Figure 10:
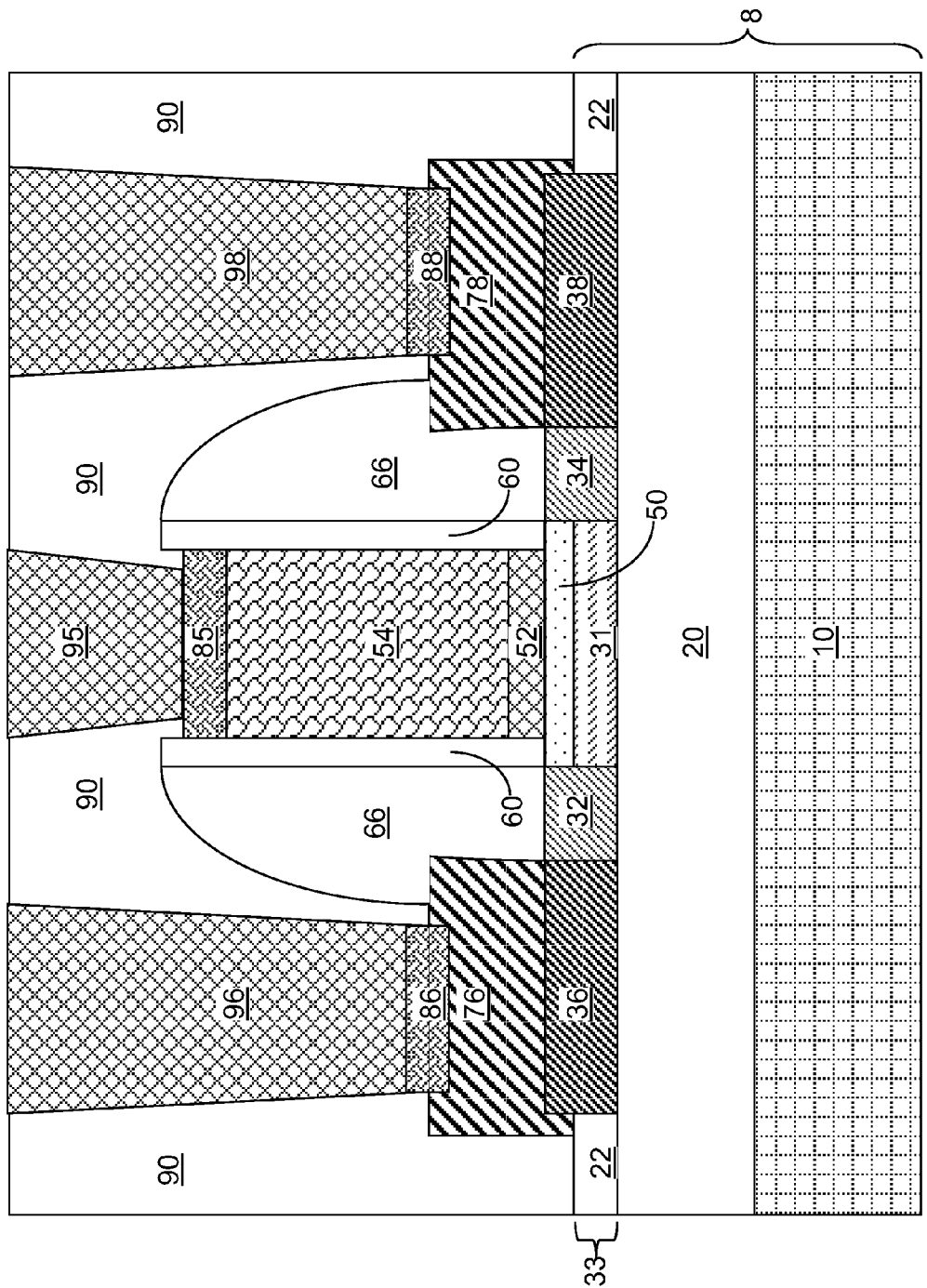
FIG. 10 is a vertical cross-sectional view of the first exemplary semiconductor structure after formation of a contact level dielectric layer and various contact via structures according to the first embodiment of the present disclosure.

Referring to FIG. 10, the gate cap dielectric 58 can be removed selective to the semiconductor material(s) of the single crystalline source extension region 32, the single crystalline drain extension region 34, the raised source region 76, and the raised drain region 78. A contact level dielectric material layer 90 is deposited over the gate electrode (52, 54), the raised source and drain regions (76, 78), and the second gate spacer 66. The contact level dielectric material layer 90 includes a dielectric material such as silicon oxide, silicon nitride, organosilicate glass (OSG), or any other dielectric material that can be employed to form metal interconnect structures therein.

Contact via holes are formed in the contact level dielectric material layer 90L, and are filled with a conductive material to form various contact via structures. The various contact via structures can include, for example, a gate contact via structure 95, a source contact via structure 96, and a drain contact via structure 98. Various metal semiconductor alloy portions can be formed before deposition of the contact level dielectric material layer 90 or after formation of the various contact via holes, for example, by deposition of a metal layer, an anneal that induces reaction between the metal in the metal layer and underlying semiconductor materials, and removal of unreacted portions of the metal layer. The various metal semiconductor alloy portions can include, for example, a gate metal semiconductor alloy portion 85, a source metal semiconductor alloy portion 86, and a drain metal semiconductor alloy portion 88.

A field effect transistor is provided, which includes a gate structure (50, 52, 54, 85, 60), source and drain extension regions, i.e., the single crystalline source and drain extension regions (32, 34), and raised source and drain regions (76, 78). Outer sidewalls of the first gate spacer 60 can be vertically coincident with sidewalls of the gate dielectric 50. The single crystalline source and drain extension regions (32, 34) contact the sidewalls of the gate dielectric 50. The raised source and drain regions (76, 78) have top surfaces that are located above topmost surfaces of the single crystalline source and drain extension regions (32, 34). Top surfaces of the single crystalline source and drain extension regions (32, 34) are vertically offset from the bottom surface of the gate dielectric 50. The second gate spacer 66 contacts outer sidewalls of the first gate spacer 60, top surfaces of the single crystalline source and drain extension regions (32, 34), and sidewalls of the raised source and drain regions (76, 78). A bottom surface of the second gate spacer 66 contacts a topmost surface of the raised source region 76, and another bottom surface of the second gate spacer 64 contacts a topmost surface of the raised drain region 78.

Figure 11:
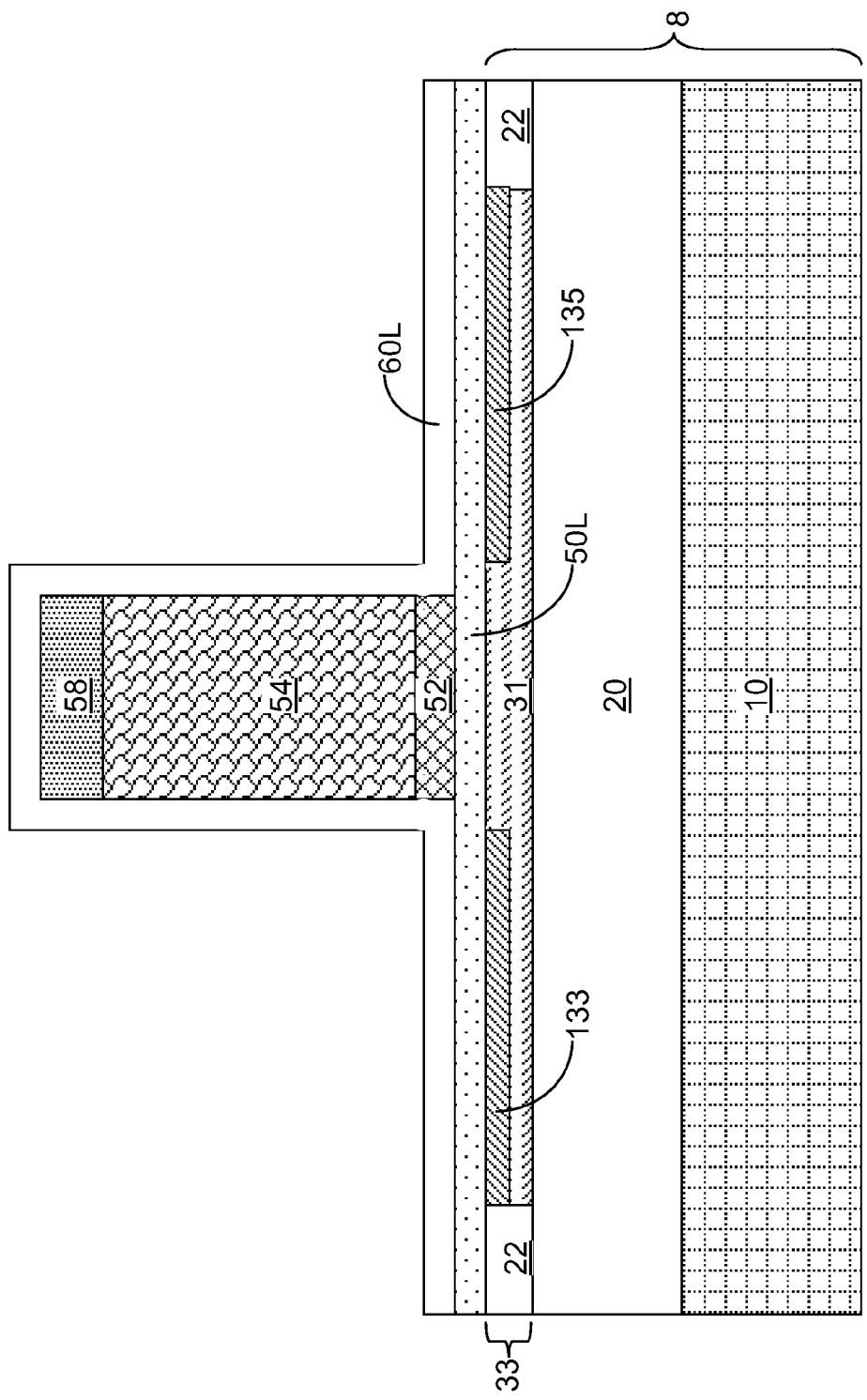
FIG. 11 is a vertical cross-sectional view of a second exemplary semiconductor structure after implantation of electrical dopants for source and drain extension formation according to a second embodiment of the present disclosure.

Referring to FIG. 11, a second exemplary semiconductor structure according to a second embodiment of the present disclosure is derived from the first exemplary semiconductor structure of FIG. 3 by implanting electrical dopants through the stack of the dielectric material layer 60L and the gate dielectric layer 50L. Electrical dopants are introduced into upper regions of the single crystalline semiconductor material portion 30 that are not covered with the gate electrode (52, 54). The electrical dopants can be introduced, for example, by ion implantation. An amorphized source extension region 133 and an amorphized drain extension region 135 are formed in regions that are implanted with the electrical dopants. The unimplanted portion of the single crystalline semiconductor material portion 30 is herein referred to as a body portion 31.

A vertical stack of an unimplanted single crystalline semiconductor region and an amorphized implanted region are formed within the areas that are not covered with the gate electrode (52, 54) and including a semiconductor material in the top semiconductor layer 33.

Specifically, the vertical stack of a peripheral bottom region of the body portion 31 and the amorphized source extension region 133 form a first vertical stack of an unimplanted single crystalline semiconductor region and an amorphized implanted region, and the vertical stack of another peripheral bottom region of the body portion 31 and the amorphized drain extension region 135 form a second vertical stack of an unimplanted single crystalline semiconductor region and an amorphized implanted region.

The peripheral bottom regions of the body portion 31 that are unimplanted single crystalline semiconductor regions include at least one monolayer of single crystalline semiconductor material, which remains single crystalline after the implantation of the electrical dopants to form the amorphized source extension region 133 and the amorphized drain extension region 135.

Figure 12:
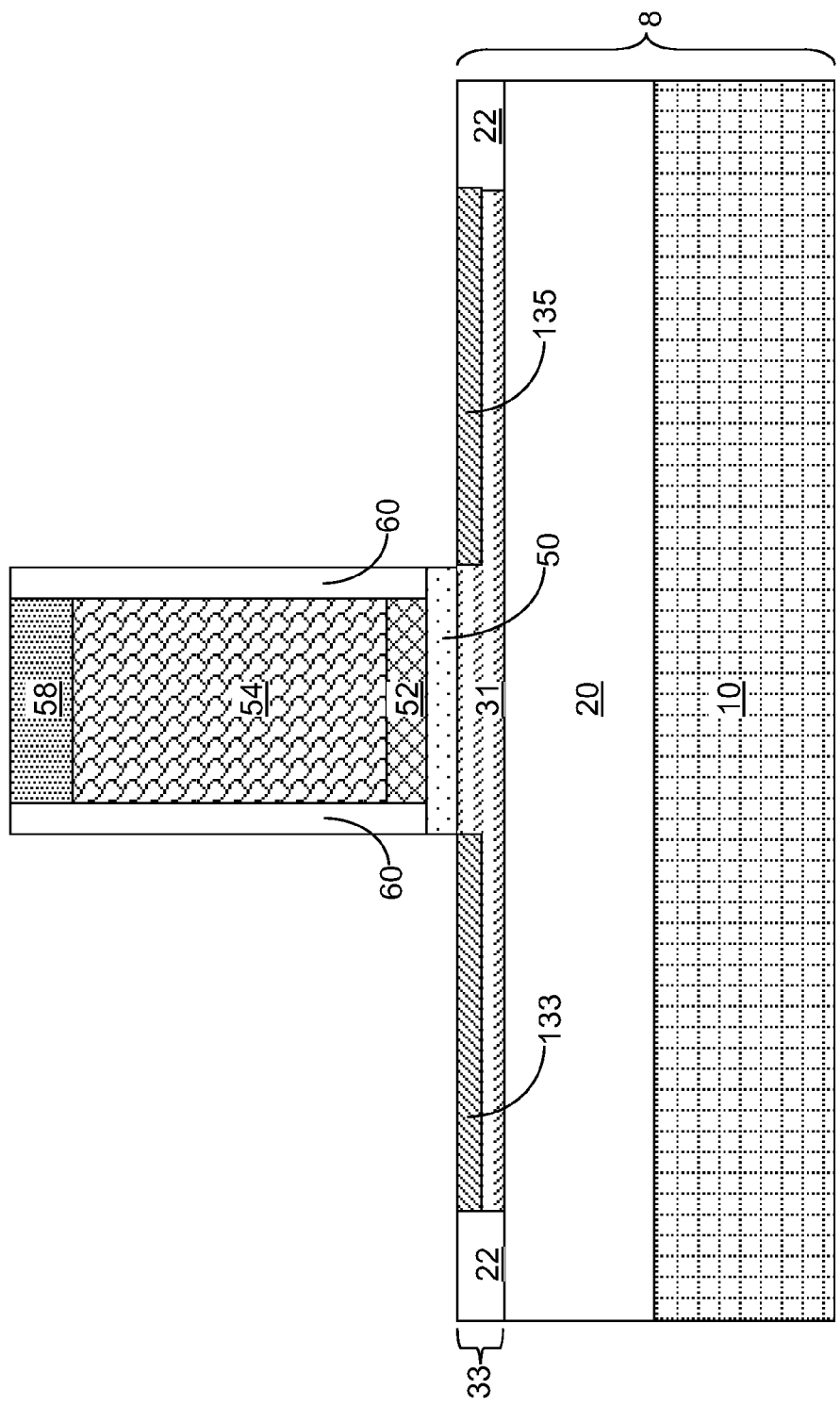
FIG. 12 is a vertical cross-sectional view of the second exemplary semiconductor structure after formation of a first gate spacer and a gate dielectric according to the second embodiment of the present disclosure.

Referring to FIG. 12, the conformal dielectric layer 60L and the gate dielectric layer 50L are anisotropically etched in an anisotropic etch process. Semiconductor surfaces of the top semiconductor layer 33, i.e., the top surfaces of the amorphized source extension region 133 and the amorphized drain extension region 135, are exposed after the anisotropic etching. A remaining portion of the gate dielectric layer 50L is a gate dielectric 50, and a remaining portion of the conformal dielectric layer 60L is a first gate spacer 60 that laterally surrounds the gate electrode (52, 54) and the gate cap dielectric 58. A gate structure is formed on the semiconductor substrate 8. The gate structure includes the gate dielectric 50, the gate electrode (52, 54), the gate cap dielectric 58, and the first gate spacer 60. The entirety of the outer sidewalls of the first gate spacer 60 is vertically coincident with the entirety of the sidewalls of the gate dielectric 50.

Figure 13:
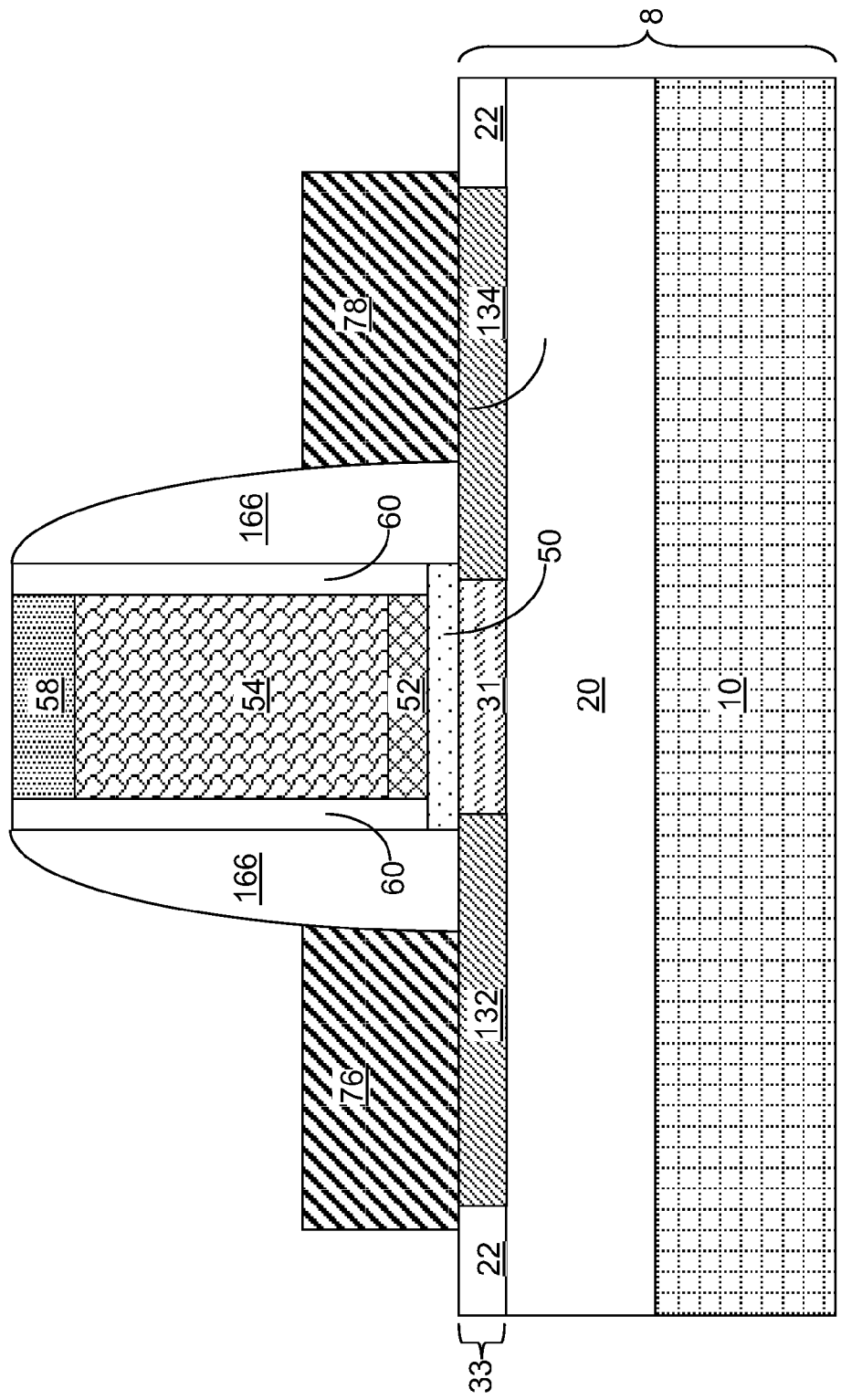
FIG. 13 is a vertical cross-sectional view of the second exemplary semiconductor structure after formation of raised source and drain regions according to the second embodiment of the present disclosure.

Referring to FIG. 13, a second gate spacer 166 is formed, for example, by conformal deposition of a dielectric material layer and an anisotropic etch that removes the horizontal portions of the dielectric material layer. The remaining vertical portions of the dielectric material layer constitute the second gate spacer 166. The second gate spacer 166 includes a dielectric material such as silicon oxide, silicon nitride, and/or silicon oxynitride. The second gate spacer 166 overlies proximal peripheral portions of the amorphized source and drain extension regions (133, 135), i.e., the portion of the amorphized source extension region 133 that is close to the gate electrode (52, 54) and the portion of the amorphized source extension region 135 that is close to the gate electrode (52, 54).

The amorphized source and drain extension regions (133, 135) are annealed after the implantation and the entirety of each of the amorphized source and drain extension regions (133, 135) become single crystalline after the annealing. During the anneal, the at least one monolayer of single crystalline semiconductor material located underneath the amorphized source and drain extension regions (133, 135) functions as the seed layer for recrystallization, and the amorphous doped semiconductor material is recrystallized to become single crystalline doped semiconductor materials. Specifically, the amorphized source extension region 133 becomes a single crystalline source extension region 132, and the amorphized drain extension region 135 becomes a single crystalline drain extension region 134. Thus, the entirety of the semiconductor materials in the body portion 31, the single crystalline source extension region 132, and the single crystalline drain extension region 134 are epitaxially aligned among one another. The body portion 31 can include undoped, i.e., intrinsic, single crystalline semiconductor material. The single crystalline source extension region 132 and the single crystalline drain extension region 134 are doped with electrical dopants of the same conductivity type.

Raised source and drain regions are formed, for example, by selective epitaxy. The raised source and drain regions include a raised source region 76 and a raised drain region 78. The raised source and drain regions (76, 78) include a single crystalline semiconductor material that is epitaxially aligned to the underlying semiconductor material, which is the semiconductor material of the single crystalline source and drain extension regions (132, 134). The semiconductor material of the raised source and drain regions (76, 78) can be the same as, or different from, the semiconductor material of the single crystalline source and drain extension regions (132, 134). The single crystalline raised source and drain regions (76, 78) are epitaxially aligned to the semiconductor material in the top semiconductor layer 33, i.e., to the semiconductor material of the single crystalline source and drain extension regions (132, 134).

In one embodiment, the raised source and drain regions (76, 78) are formed with in-situ doping so that the raised source and drain regions (76, 78) are doped with electrical dopants during selective epitaxy. In this embodiment, the raised source and drain regions 78 are in-situ doped with electrical dopants of the same type as the electrical dopants in the single crystalline source and drain extension regions (132, 134). The electrical dopants of the raised source and drain regions (76, 78) can be either p-type or n-type.

Alternately, the raised source and drain regions (76, 78) are formed without doping so that the raised source and drain regions (76, 78) are formed as intrinsic semiconductor material portions. Electrical dopants can be subsequently introduced into the raised source and drain regions (76, 78) by ion implantation, plasma doping, and/or gas phase doping. In this embodiment, the electrical dopants introduced into the raised source and drain regions 78 have the same type of doping as the electrical dopants in the single crystalline source and drain extension regions (132, 134). The electrical dopants of the raised source and drain regions (76, 78) can be either p-type or n-type.

Figure 14:
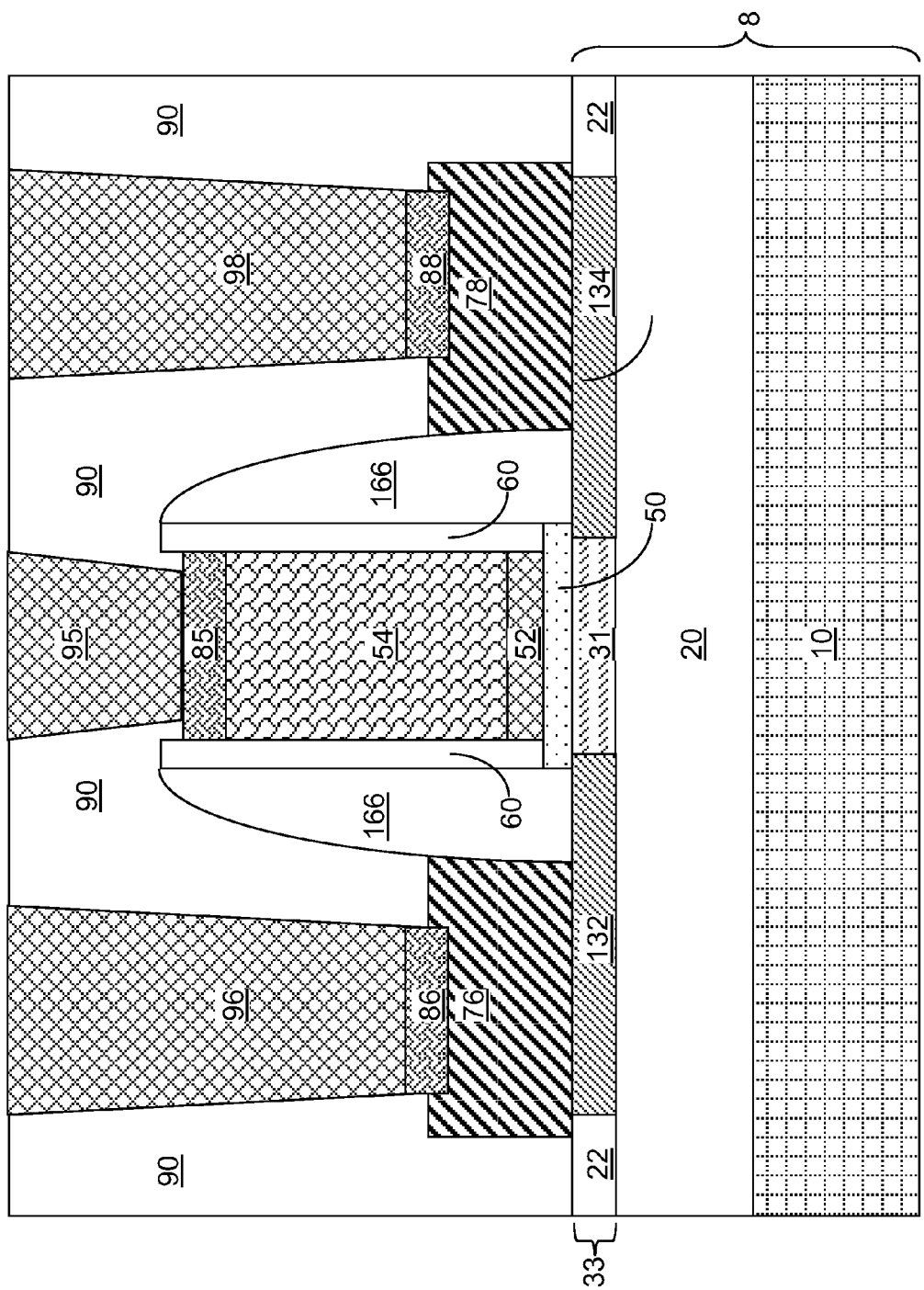
FIG. 14 is a vertical cross-sectional view of the second exemplary semiconductor structure after formation of a contact level dielectric layer and various contact via structures according to the second embodiment of the present disclosure.

Referring to FIG. 14, the gate cap dielectric 58 can be removed selective to the semiconductor material of the raised source region 76 and the raised drain region 78. A contact level dielectric material layer 90 is deposited over the gate electrode (52, 54), the raised source and drain regions (76, 78), and the second gate spacer 166. The contact level dielectric material layer 90 includes a dielectric material such as silicon oxide, silicon nitride, organosilicate glass (OSG), or any other dielectric material that can be employed to form metal interconnect structures therein.

Contact via holes are formed in the contact level dielectric material layer 90L, and are filled with a conductive material to form various contact via structures. The various contact via structures can include, for example, a gate contact via structure 95, a source contact via structure 96, and a drain contact via structure 98. Various metal semiconductor alloy portions can be formed before deposition of the contact level dielectric material layer 90 or after formation of the various contact via holes, for example, by deposition of a metal layer, an anneal that induces reaction between the metal in the metal layer and underlying semiconductor materials, and removal of unreacted portions of the metal layer. The various metal semiconductor alloy portions can include, for example, a gate metal semiconductor alloy portion 85, a source metal semiconductor alloy portion 86, and a drain metal semiconductor alloy portion 88.

A field effect transistor is provided, which includes a gate structure (50, 52, 54, 85, 60), source and drain extension regions, i.e., the single crystalline source and drain extension regions (132, 134), and raised source and drain regions (76, 78). Outer sidewalls of the first gate spacer 60 can be vertically coincident with sidewalls of the gate dielectric 50. The raised source and drain regions (76, 78) have top surfaces that are located above topmost surfaces of the single crystalline source and drain extension regions (132, 134). Top surfaces of the single crystalline source and drain extension regions (132, 134) can be coplanar with the bottom surface of the gate dielectric 50. The second gate spacer 166 contacts outer sidewalls of the first gate spacer 60, top surfaces of the single crystalline source and drain extension regions (32, 34), and sidewalls of the raised source and drain regions (76, 78). Raised source and drain regions (76, 78) contacts outer sidewalls of the second gate spacer 166. The bottom surface of the gate electrode (52, 54) and the bottom surface of the first gate spacer 60 are coplanar with each other and contact a planar top surface of the gate dielectric 50. The single crystalline source and drain extension regions (132, 134) can have a same composition throughout and contact bottom surfaces of the raised source and drain regions (76, 78) at a top surface of the top semiconductor layer 33.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
 a gate structure including at least a gate dielectric, a gate electrode, and a first gate spacer and located on a semiconductor layer in a semiconductor substrate, wherein outer sidewalls of said first gate spacer is vertically coincident with sidewalls of said gate dielectric;
 source and drain extension regions that contact said sidewalls of said gate dielectric;

planar source and drain regions that contact sidewalls of said source and drain extension regions, wherein topmost surfaces of said planar source and drain regions are coplanar with top surfaces of said source and drain extension regions and bottommost surfaces of said planar source and drain regions are coplanar with bottom surfaces of said source and drain extension regions; and raised source and drain regions located on said semiconductor layer and having top surfaces located above said topmost surfaces of said source and drain extension regions and having bottom surfaces that are coplanar with said top surfaces of said source and drain extension regions.

2. The semiconductor structure of claim 1, wherein said gate dielectric comprises a dielectric material having a dielectric constant greater than 8.0.

3. The semiconductor structure of claim 1, wherein top surfaces of said source and drain extension regions are vertically offset from a bottom surface of said gate dielectric.

4. The semiconductor structure of claim 1, further comprising a second gate spacer that contacts outer sidewalls of said first gate spacer, said top surfaces of said source and drain extension regions, and sidewalls of said raised source and drain regions.

5. The semiconductor structure of claim 4, wherein a bottom surface of said second gate spacer contacts a topmost surface of said raised source and drain regions.

6. A semiconductor structure comprising:

a gate structure including at least a gate dielectric, a gate electrode, and a first gate spacer and located on a semiconductor layer in a semiconductor substrate, wherein outer sidewalls of said first gate spacer is vertically coincident with sidewalls of said gate dielectric, and said gate dielectric has a dielectric constant greater than 8.0;

a second gate spacer contacting said outer sidewalls of said first gate spacer, said sidewalls of said gate dielectric, and top surfaces of said semiconductor layer;

raised source and drain regions located on said semiconductor layer and contacting outer sidewalls of said second gate spacer; and source and drain extension regions, wherein topmost surfaces of said source and drain extension regions are coplanar with a bottom surface of said gate dielectric, bottommost surfaces of said second gate spacer, and bottommost surfaces of said raised source and drain regions.

7. The semiconductor structure of claim 6, wherein a bottom surface of said gate electrode and a bottom surface of said first gate spacer are coplanar with each other and contact a planar top surface of said gate dielectric.

8. The semiconductor structure of claim 6, wherein said second gate spacer contacts outer sidewalls of said first gate spacer and sidewalls of said raised source and drain regions.

9. The semiconductor structure of claim 8, wherein said source and drain extension regions have a same composition throughout and contacts bottom surfaces of said raised source and drain regions at a top surface of said semiconductor layer.

10. The semiconductor structure of claim 6, wherein said raised source and drain regions are epitaxially aligned to a semiconductor material in said semiconductor layer, and said gate electrode includes a metal portion that contacts said gate dielectric.

* * * * *